United States Patent
Boggs

[11] Patent Number: 6,087,191
[45] Date of Patent: Jul. 11, 2000

[54] METHOD FOR REPAIRING SURFACE DEFECTS

[75] Inventor: Karl E. Boggs, Poughkeepsie, N.Y.

[73] Assignee: International Business Machines Corporation, Armonk, N.Y.

[21] Appl. No.: 09/012,142

[22] Filed: Jan. 22, 1998

[51] Int. Cl.⁷ .................................................. B24B 1/00
[52] U.S. Cl. ........................... 438/12; 438/4; 438/758; 438/761; 438/773
[58] Field of Search ................. 438/12, 758, 773, 438/761, 4

[56] References Cited

U.S. PATENT DOCUMENTS

| | | |
|---|---|---|
| 4,116,714 | 9/1978 | Basi . |
| 4,129,457 | 12/1978 | Basi . |
| 4,135,952 | 1/1979 | Anderson et al. . |
| 5,217,566 | 6/1993 | Pasch et al. . |
| 5,643,649 | 7/1997 | Hagan et al. . |
| 5,934,978 | 8/1999 | Burke et al. ............................ 451/36 |

*Primary Examiner*—Charles Bowers
*Assistant Examiner*—Lisa Kilday
*Attorney, Agent, or Firm*—Ratner & Prestia; Jay H. Anderson

[57] ABSTRACT

A method for repairing defects in a surface layer of a substrate. The method comprises the redeposition, in a solvent environment, of a fill material into the defects of the surface layer. The fill material is provided by the surface layer itself or from a separate source comprising a different material from that of the surface layer.

21 Claims, 1 Drawing Sheet

METHOD FOR REPAIRING SURFACE DEFECTS

TECHNICAL FIELD

The present invention relates generally to the repair of defects on a surface. More particularly, the invention relates to the redeposition, in a solvent environment, of a source material into wafer surface defects in order to repair the defects.

BACKGROUND OF THE INVENTION

In semiconductor manufacture and in related processing schemes which are dependent upon smooth, defectfree surfaces (i.e., surfaces free from scratches, divots, voids, and the like), it becomes necessary to have methods for repairing (or healing) defects which may occur in the surface. In the manufacture of semiconductors, for instance, there are steps involving chemical and mechanical polishing or planarizing of the wafer surface. These polishing or planarizing steps often cause scratches and other defects on the wafer surface. With the advent of microminiaturization of electronic devices, the need for damage-free and smooth semiconductor wafer surfaces has become increasingly important. Accordingly, there is a need for a method of repairing these defects.

Currently, there are relatively few methods for repairing polishing scratches, each of which has its related problems. The most commonly used method for eliminating a scratch is to polish the layer down (i.e., reduce the thickness) until the scratch is no longer present. This method is obviously ineffective, however, if the scratches are too deep. Another commonly used method entails increasing the environmental temperature around the surface layer whereby the layer melts and reflows into the defects. In other words, the layer fills its own scratches. Because this process requires elevated temperatures, however, it can only be used with insulating materials having a low melting point. If the temperature gets too high, doped regions of the workpiece will diffuse causing a degradation of electrical performance. This thermal processing limitation is referred to as thermal budget.

Therefore, there is a need for a surface defect repair method which does not impact the thermal budget of the workpiece, and which is effective in removing even deep scratches.

SUMMARY OF THE INVENTION

To meet this and other needs, and in view of its purposes, the present invention provides a method for repairing or curing defects on a layer of a substrate. The method generally includes, in a solvent environment, redepositing a fill material into the defects. The present invention more particularly provides a method for repairing defects on a layer of a substrate which, as a first step, forms a solvent environment. The substrate is then inserted into the solvent environment and allowed to remain in the solvent environment for a time sufficient to repair the defects. Finally, the repaired substrate is removed from the solvent environment. It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing is the following figure.

DETAILED DESCRIPTION OF THE INVENTION

Figure 1:
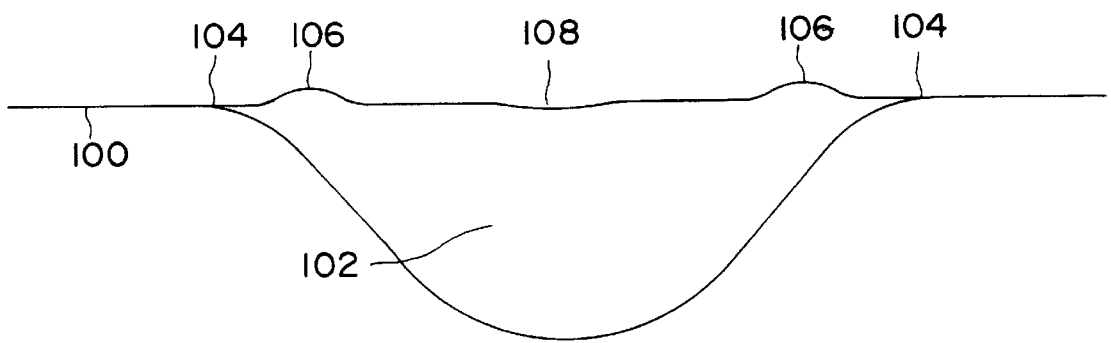
FIG. 1 is a schematic cross-sectional view of a defect after having been filled according to the present invention.

The present invention applies to the repair of surface defects on any surface requiring a smooth, defect-free surface. The invention is preferably used to repair surface defects which occur on semiconductor wafer surfaces during semiconductor processing steps. Such defects typically occur following chemical mechanical polishing in a semiconductor processing flow.

The process of the present invention is used to either deposit a fill material into defects or to redeposit the insulator phase into the defects. The process is based on two mechanisms. First, scratches and some other types of defects (divots, pinholes, and the like) have an associated high surface energy due to the small curvature and large area of the defect surfaces. A system that allows material transport will be driven to reduce the surface area and thus repair the defect. Second, under certain hydrothermal or supercritical atmospheric conditions, insulator materials such as silica and polymers have a high solubility and, as such, can move freely to the defect sites.

The mechanisms forming the basis for the method of the present invention, as just described, rely on the physical theory that, under specified conditions, a dissolved material will migrate to areas having high surface energy. Examples of such high energy areas include those having a small radius of curvature, such as corners and edges. Dissolved material in a solvent environment will naturally migrate to such high energy areas, and will then deposit at such areas, rounding out the edges and corners and reducing the surface energy. Eventually, the corners and edges will be mostly filled in and the surface energy will be so low that the dissolved material will no longer deposit out of the solvent at those locations. This basic theory drives the mechanism of the present invention.

In order for the method of the invention to function, it is essential to provide an adequate environment which will cause the fill material to dissolve and redeposit. The determination of what comprises an adequate environment is dictated by the composition of the surface layer or the fill material. Silica and other inorganic materials are very common materials used in semiconductor processing to form insulating layers. Therefore, a hydrothermal environment is a preferred environment which can dissolve such materials. Some examples of such materials include silicon oxide, doped silicon oxide, silicon nitride, titanium oxide, aluminum oxide, doped and undoped silicate glasses, aluminosilicate glasses, magnesium oxide, zirconium oxide, mullite, fosterite, cordierite, glasses and crystalline phases comprised of combinations of $SiO_2$, $TiO_2$, MgO, BaO, CaO, $Na_2O$, $K_2O$, $Li_2O$, $ZrO_2$, $Al_2O_3$, BeO, and combinations thereof.

Hydrothermal steam is a preferred form of the hydrothermal environment. Such a hydrothermal environment can be brought about by adding steam to a high pressure, medium-high temperature environment. The temperature should never be raised to a point which will disrupt the thermal budget of the workpiece (i.e., to a temperature that will allow continued diffusion of other materials diffused within the workpiece). Thus, temperature should range from 350° C. to 700° C. Although pressure will naturally increase with the increased temperature, it is preferred that the pressure be maintained between 60 and 180 atm, and most preferably between 80 and 180 atm. An example of an environment which is suitable for this method is the environment found within an autoclave.

There is a limitation to the use of a hydrothermal environment in that certain materials, such as exposed aluminum and copper, will corrode when subjected to such an environment. In order to overcome this limitation, a thin layer of oxide can be placed over the threatened layer prior to entering the hydrothermal environment. The scratch will replicate with the coating and defects can be repaired without a concern for corrosion.

An alternate embodiment is contemplated which is adapted to cater to organic fill materials, such as polymers. Because organic materials will not dissolve in a hydrothermal environment, supercritical carbon dioxide is used as the solvent in the environment. Some examples of organic materials which will readily dissolve and redeposit in such an environment include polyimides, polycyclobutenes, parylene, polyethers, polyesters, fluorinated polymers, polyamides, and polysulfones.

A third embodiment is contemplated in which a supercritical ammonia environment is provided in place of a hydrothermal environment. The supercritical ammonia environment is well suited for silica and other inorganic materials.

The fill material which is used to fill in the defects, by dissolving and redepositing in the defects, can be provided from the insulator itself or from a separate source. Either method is suitable, although it is preferred that a separate source of defect-fill material be used instead of relying on the insulator itself to provide the redeposited material. Self-sourcing is less desirable because it may take too much surface material away from other areas of the surface. In this regard, it is preferred that the separate source material be chosen to match closely the properties of the workpiece surface but, more important, to have faster dissolution and transport behavior in the hydrothermal environment. These characteristics would allow shorter dwell time and possibly gentler conditions than the original insulative material would require for repair of defects.

When a separate source material having different characteristics than the insulator itself is used to fill in the defects, the defects are filled with a dissimilar material which leaves a signature of the process. The use of the procedure can be detected and optimized as necessary for a given system.

For example, when a separate source material is used as a fill material for defect 102 in surface 100, the defect fill profile will appear as shown in FIG. 1. At the corners 104 of defect 102, there will be slight convex areas (exagerated in FIG. 1), or bumps, 106, where the dissolved fill material has initially migrated. As previously explained, this is due to the high surface energy at these areas. At the center 108 of filled defect 102, the fill material will be slightly concave, or non-coplanar, with the surface 100.

In the operation of the method using a hydrothermal environment, the atmosphere (preferably in a chamber) is evacuated and then filled with steam. The workpiece of interest is then obtained. The workpiece will include an inorganic insulator having defects, such as a semiconductor wafer after chemical mechanical polishing having scratches or divots on its surface. The workpiece is cleaned and the surface may be treated to make it hydrophilic or to increase the surface energy through chemical modification, such as treatment with an HF dip.

The workpiece is then placed into the hydrothermal environment alone or with a source of another insulator material. The pressure and temperature of the environment are raised into the hydrothermal regime (typically, above about 350° C. and above about 80 atmospheres). Pressure and temperature are maintained under hydrothermal conditions for sufficient time to repair scratches and other high energy defects. In particular, while in this environment, the insulating material dissolves and redeposits at locations having a high surface energy (i.e., at surface defects). The workpiece dwells for a time sufficient to repair these defects; the time varies depending upon the amount and severity of the defects, the insulator composition, and the temperature and pressure of the environment.

Pressure and temperature are then reduced slowly to ambient conditions, allowing the redeposited material to cool while limiting stress build-up in the structure. The workpiece is then cleaned and reintroduced into the process flow. Alternatively, the workpiece may receive a buff polish before processing is continued.

In an alternative embodiment, in which the environment includes supercritical carbon dioxide in order to work with polymeric insulators, a chamber is prepared in the same manner as described for the hydrothermal process. The workpiece is cleaned and the surface is modified to bind to a polymeric precursor. A wet clean process is sufficient to form a surface with which the polymer can chemically bond. One example is the standard RCA clean. Alternatively, an adhesion promoter could be applied prior to the treatment in the polymer solvent system. Typical adhesion promoters are siloxanes which chemically bond to the surface of the workpiece and provide functional groups that will react with the polymer to chemically attach the polymeric film to the substrate. The adhesion promoter could be applied by dipping into a bath, spraying, or spin-coating, among others. The workpiece is then placed in the supercritical environment with the polymeric precursor source.

Pressure is raised to a supercritical point (about 304° K and about 7.375 Mpa) and allowed to dwell such that material transport fills the defects. Once the defects are filled, the pressure is reduced to ambient. It is preferred that the precursor material is then cured either by heat or ultraviolet exposure depending on the precursor chemistry. Any excess material can be removed by buff polish, laser ablation, and the like. The workpiece is then cleaned and returned to the process flow.

Although described herein with reference to certain specific embodiments, the present invention is nevertheless not intended to be limited to the details shown. Rather, various modifications may be made in the details within the scope and range of equivalents of the claims and without departing from the spirit of the invention.

What is claimed:

1. A method for repairing defects on a layer of a substrate, the method comprising, in a solvent environment, redepositing a fill material into the defects, the solvent environment further comprises a hydrothermal environment.

2. The method of claim 1 wherein the fill material comprises the layer having the defects.

3. The method of claim 1 wherein the fill material comprises a material different from the material which comprises the layer having the defects.

4. The method of claim 1 wherein the hydrothermal environment is maintained at a temperature in the range of about 350° C. to 700° C. and a pressure in the range of about 60 atmospheres to 180 atmospheres.

5. The method of claim 1 wherein the fill material comprises an inorganic material.

6. The method of claim 5 wherein the inorganic material is selected from the group consisting of silicon oxide, doped silicon oxide, silicon nitride, titanium oxide, aluminum oxide, doped and undoped silicate glasses, aluminosilicate glasses, magnesium oxide, zirconium oxide, mullite, fosterite, cordierite, glasses and crystalline phases comprised of combinations of $SiO_2$, $TiO_2$, MgO, BaO, CaO, $Na_2O$, $K_2O$, $Li_2O$, $ZrO_2$, $Al_2O_3$, BeO, and combinations thereof.

7. A method for repairing defects on a layer of a substrate, the method comprising, in a solvent environment, redepositing a fill material into the defects, the solvent environment further comprises a supercritical carbon dioxide environment.

8. The method of claim 7 wherein the supercritical carbon dioxide environment is maintained at a temperature in the range of about 31° C. to 400° C. and a pressure in the range of about 73 atmospheres to 180 atmospheres.

9. The method of claim 7 wherein the source material comprises an organic material.

10. The method of claim 9 wherein the organic material is a polymer selected from the group consisting of polyimides, polycyclobutenes, parylene, polyethers, polyesters, fluorinated polymers, polyamides, and polysulfones.

11. A method for repairing defects on a layer of a substrate, the method comprising the steps of:
  A. forming a solvent environment comprising a hydrothermal environment which is maintained at a temperature in the range of about 350° C. to 700° C. and a pressure in the range of about 60 atmospheres to 180 atmospheres;
  B. inserting the substrate into the solvent environment;
  C. allowing the substrate to remain in the solvent environment for a time sufficient to repair the defects, and redepositing a fill material into the defects; and
  D. removing the repaired substrate from the solvent environment.

12. The method of claim 11 wherein the fill material comprises the layer having the defects.

13. The method of claim 11 further comprising the step of, prior to step C, inserting a fill material into the solvent environment, the fill material comprising a material which is different from the material comprising the layer having the defects.

14. The method of claim 11 wherein the fill material comprises an inorganic material.

15. The method of claim 14 wherein the inorganic material is selected from the group consisting of silicon oxide, doped silicon oxide, silicon nitride, titanium oxide, aluminum oxide, doped and undoped silicate glasses, aluminosilicate glasses, magnesium oxide, zirconium oxide, mullite, fosterite, cordierite, glasses and crystalline phases comprised of combinations of $SiO_2$, $TiO_2$, MgO, BaO, CaO, $Na_2O$, $K_2O$, $Li_2O$, $ZrO_2$, $Al_2O_3$, BeO, and combinations thereof.

16. The method of claim 13 wherein the solvent environment further comprises a supercritical carbon dioxide environment.

17. The method of claim 16 wherein the supercritical carbon dioxide environment is maintained at a temperature in the range of about 31° C. to 400° C. and a pressure in the range of about 73 atmospheres to 180 atmospheres.

18. The method of claim 16 wherein the fill material comprises an organic material.

19. The method of claim 18 wherein the organic fill material is a polymer selected from the group consisting of polyimides, polysulfones, polycyclobutene, and parylene.

20. A method for repairing defects on a layer of a substrate, the method comprising the steps of:
  A. forming a solvent hydrothermal environment;
  B. maintaining the environment at a temperature in the range of about 350° C. to 700° C. and a pressure in the range of about 60 atmospheres to 180 atmospheres;
  C. placing the substrate into the environment;
  D. inserting an inorganic fill material into the environment, the fill material selected from the group consisting of silicon oxide, doped silicon oxide, silicon nitride, titanium oxide, aluminum oxide, doped and undoped silicate glasses, aluminosilicate glasses, magnesium oxide, zirconium oxide, mullite, fosterite, cordierite, glasses and crystalline phases comprised of combinations of $SiO_2$, $TiO_2$, MgO, BaO, CaO, $Na_2O$, $K_2O$, $Li_2O$, $ZrO_2$, $Al_2O_3$, BeO, and combinations thereof;
  E. allowing the substrate to remain in the environment for a time sufficient to redeposit the fill material into the defects, thereby curing the defects; and
  F. removing the repaired substrate from the environment.

21. A method for repairing defects on a layer of a substrate, the method comprising the steps of:
  A. forming a solvent supercritical carbon dioxide environment;
  B. maintaining the environment at a temperature in the range of about 31° C. to 400° C. and a pressure in the range of about 73 atmospheres to 180 atmospheres;
  C. placing the substrate into the environment;
  D. inserting an inorganic fill material into the environment, wherein the fill material is a polymer selected from the group consisting of polyimides, polycyclobutenes, parylene, polyethers, polyesters, fluorinated polymers, polyamides, and polysulfones;
  E. allowing the substrate to remain in the environment for a time sufficient to redeposit the fill material into the defects, thereby curing the defects; and
  F. removing the repaired substrate from the solvent environment.

* * * * *

UNITED STATES PATENT AND TRADE MARK OFFICE
CERTIFICATE OF CORRECTION

PATENT NO.   : 6,087,191
DATED        : July 11, 2000
INVENTOR(S)  : Karl E. Boggs It is certified that error appears in the above-identified patent and that said Letters Patent is hereby corrected as shown below:

In Column 6, line 4, delete "13" and insert --11--.

Signed and Sealed this

First Day of May, 2001

Attest:

NICHOLAS P. GODICI

*Attesting Officer*    *Acting Director of the United States Patent and Trademark Office*